United States Patent [19]

Enomoto et al.

[11] Patent Number: 4,703,483
[45] Date of Patent: Oct. 27, 1987

[54] CHIP ON CHIP TYPE INTEGRATED CIRCUIT DEVICE

[75] Inventors: Yoshinori Enomoto; Hideo Monma, both of Kawasaki; Shunzo Ohta, Aizuwakamatsu; Takeshi Sasaki, Kawasaki, all of Japan

[73] Assignee: Fujitsu Limited, Kawasaki, Japan

[21] Appl. No.: 759,448

[22] Filed: Jul. 26, 1985

[30] Foreign Application Priority Data

Jul. 27, 1984 [JP] Japan ................................ 59-156618
Nov. 16, 1984 [JP] Japan ................................ 59-241977

[51] Int. Cl.$^4$ ........................................... G01R 31/28
[52] U.S. Cl. ..................................... 371/24; 371/15; 324/73 R
[58] Field of Search ..................... 371/15, 23, 24, 25; 324/73 R, 73 PC

[56] References Cited

U.S. PATENT DOCUMENTS

| | | | |
|---|---|---|---|
| 4,241,307 | 12/1980 | Hong | 371/25 X |
| 4,244,048 | 1/1981 | Tsui | 371/25 X |
| 4,497,056 | 1/1985 | Sugamori | 324/73 R X |
| 4,503,386 | 3/1985 | Dasgupta | 324/73 R |
| 4,504,784 | 3/1985 | Goel | 324/73 R |
| 4,509,008 | 4/1985 | Dasgupta | 324/73 R |

Primary Examiner—Jerry Smith
Assistant Examiner—Robert W. Beausoliel, Jr.
Attorney, Agent, or Firm—Staas & Halsey

[57] ABSTRACT

A circuit for checking the integrity of interconnections between chips in a chip-on-chip type IC device is fabricated in respective portions on the lower and upper chips in peripheral areas thereof intermediate the inner logic circuit of each chip and the corresponding bonding pads. Selection circuits connected between the inner logic circuit signal terminals and the corresponding bonding pads of the chip are switched by control signals to be isolated and permit normal operation of the chip or to a checking mode to isolate the inner logic circuit and permit transmission of test signals through the interconnections. The test signals received through the interconnections are compared with the test signals as transmitted to determine the integrity of the individual interconnections. The disclosed apparatus and method provide for testing of the integrity of interconnections defining single direction signal paths of individual interconnections, as between the upper and lower chips, and for selectively bidirectional transmission through the individual interconnections.

17 Claims, 7 Drawing Figures

CHIP ON CHIP TYPE INTEGRATED CIRCUIT DEVICE

BACKGROUND OF THE INVENTION

1. Field of the Invention

This invention relates to a chip on chip type integrated circuit (IC) device which comprises a plurality of chips mounted in stacked relationship and electrically interconnected, in a single IC package and, more particularly, to a circuit and related method for checking the integrity of the interconnections providing signal paths between the chips in such a chip on chip type IC device.

2. State of the Prior Art

Because of the increasing levels of integration and the corresponding, more complicated circuit functions required to be performed in IC devices, current large scale integrated (LSI) circuits often must include different types of circuits in a single package. For example, a single LSI circuit may be required to include CMOS (complimentary MOS) circuits and TTL (transistor-transistor logic) circuits, or both a CMOS digital circuit and an analog circuit. Sometime it also is required that CMOS circuits be included in an ECL (emitter coupled logic) circuit having an interface circuit. It is very difficult to provide such different kinds of circuits in a single chip, or even in those instances when such a chip can be fabricated, high production yields cannot be expected with the present state-of-the-art technology, because of the requirement that the circuit include both FET circuits and bipolar circuits in a single chip.

To satisfy these requirements in light of the difficulties of producing such single chip structures, recently there has been adopted a chip on chip type structure; particularly, such a structure attempts to satisfy the requirements as before noted, by bonding a first chip fabricated in accordance with one process sequence to another chip which is fabricated in accordance with a different process sequence, in a single package. In such structures, and even though the individual chips are tested and appropriately selected before being stacked, one on the other, the reliability of the chips as combined into a single package is not always satisfactory, because the interconnections between the chips may introduce problems. While visual inspection is effective for checking the integrity of such interconnections, including the bonding, between the chips, it is limited only to the peripheral portions of the chips which are visible and thus is inadequate.

For example, in the case of chip on chip type IC's, such as memory on logic chips or logic on logic chips, each of the individual logic circuit chip and the memory circuit chip may be checked easily and routinely, prior to being stacked and bonded together. However, it is difficult to check the chips after they have been assembled and bonded, because the upper chip is usually bonded in an upside down position on the lower chip, in facing relationship. Thus, the electric contact, or bonding, pads of the upper chip are not accessible, and therefore it is difficult to check electrically the integrity and completeness of the wiring and bonding forming the interconnections between the upper and lower chips.

The problems presented in chip on chip type IC devices, with regard to the integrity of the wiring and bonding between the stacked chips, has not been particularly serious heretofore, since the scale or level of integration was not particularly great; however, the problem is becoming increasingly serious as the scale of integration of IC devices increases and as, concomitantly, the number of bonds to complete interconnections between the chips increases.

SUMMARY OF THE INVENTION

An object of the present invention, therefore, is to provide a means to check the integrity of the interconnections, including wiring and/or bonding, between chips assembled in a chip on chip type IC.

A further and more specific object of the present invention is to provide a circuit which is fabricated directly on the periphery of a chip, as employed in a chip on chip type IC, which enables electrically checking the integrity of the interconnections, including wiring and/or bonding, between the chips.

A more general object of the present invention is to increase the reliability of chip on chip type IC devices, by affording a means to check the integrity of the interconnections between the chips and thereby provide data for analyzing directly the presence of defects in the interconnections, affording a basis for improving production processes, including the bonding processes employed to provide interconnections, used in fabricating chip on chip type IC devices.

In order to achieve the foregoing objects, the present invention provides a checking circuit which is fabricated on peripheral areas of the chips, and which is switched to a checking mode or to a operating mode by a control signal applied to a control terminal which is positioned at a peripheral edge of one of the chips. As will be understood, the interconnections between the chips may be fabricated in different ways, and may include wiring, direct bonding, or the like, examples of which are shown later herein. Moreover, it will be understood that in certain such devices, the interconnections define signal paths of first and second different types, or directions, namely, in the direction from the lower chip to the upper chip and in the direction from the upper chip to the lower chip, while in others the interconnections may define selective, bidirection signal paths. The checking circuit of the invention correspondingly checks the integrity of the interconnections with reference to the signal paths defined by the respective interconnections. In accordance with a first embodiment of the invention, first and second checking circuits are employed corresponding to the first and second different directions of the signal paths defined by the respective interconnections. In accordance with a second embodiment of the invention, a single checking circuit is provided which functions for checking bidirectional interconnections.

In both embodiments of the invention, when switched to a normal operating mode, the checking circuit is isolated from the inner, or main, logic circuits of the associated chips, which then operate in their original, intended fashion. Conversely, when the checking circuit is switched to the checking mode, the checking circuit bypasses the inner logic circuit of the associated chip. Particularly, the checking circuit is connected between the input pads and the output pads of the associated chip such that when switched to the checking mode, it operates as a bypass circuit between the input pads and output pads thereby isolating the inner logic circuit of the chip.

More particularly, in the specific example of a chip on chip IC device in which the individual interconnections are dedicated to a single signal path direction, the output pads of the lower chip are connected to corresponding input pads of the upper chip. Accordingly, in the checking mode of the checking circuit, a checking signal is sent from the input pads of the lower chip, through the checking circuit and thus bypassing the inner logic circuit of the lowr chip, to the output pads of the lower chip and through the respective interconnections to the corresponding input pads of the upper chip. In this regard, each of the input pads of the lower chip is accessed individually, in sequence, in performing the checking operation. The upper chip further is provided with a component of the checking circuit, fabricated again on its peripheral area, which is connected to the input pads of the upper chip, for receiving the checking signal as received through each of the corresponding interconnections, in individual sequence, and which transmits each such checking signal through a return signal path, including a further interconnection between an output pad of the upper chip and an input pad of the lower chip and thereafter through a circuit on the lower chip to a detection terminal on the lower chip, which may comprise a specific output pad of the lower chip. Accordingly, the integrity of each interconnection may be established by monitoring the output signal appearing on the specific output pad of the lower chip. In this first embodiment, a second circuit is provided for checking the interconnections defining the second signal path direction, i.e., from the upper chip to the lower chip, which functions in a similar manner and is of similar configuration, with slight modifications, to that of the first circuit.

The second disclosed embodiment of the invention is employed with chip on chip type IC devices in which the interconnections are selectively bidirectional, and comprises a modification of the first circuit of the first embodiment which checks the interconnections of the first type, i.e., those which define signal paths from the lower to the upper chip.

As before noted, the integrity check of each interconnection is performed in individual succession, as is readily accomplished by conventional chip checking equipment such as a probe tester, for example, and thus no specially designed equipment is necessary to perform the interconnection integrity checking function afforded by the circuit of the invention.

While the principal basis or function of the present invention is believed clear from the foregoing, various specific implementations and operating characteristics, such as may be required to apply the invention to specific, practical integrated circuit chips, will be readily apparent to those skilled in the art. Details of the specific implementation and modifications of the circuit of the invention, and the advantages afforded thereby, will be made clear from the following detailed description of the preferred embodiments, taken with reference to the accompanying drawings.

DESCRIPTION OF PREFERRED EMBODIMENTS

Figure 1:
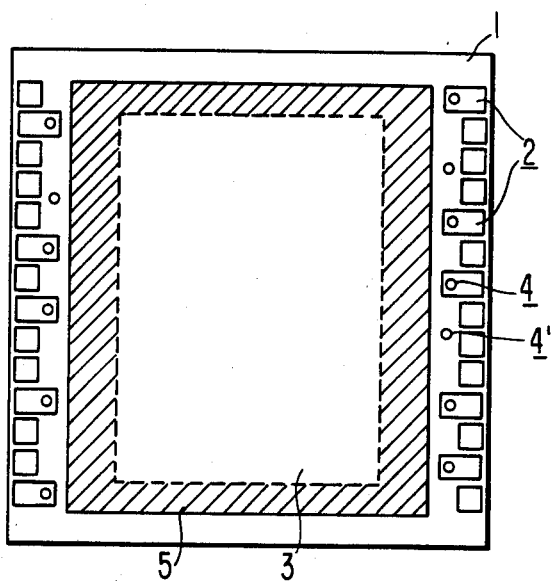
FIG. 1 is a schematic, simplified plan view of an integrated circuit (IC) chip for incorporating the circuit of the present invention, illustrating the peripheral portion of the chip on which the checking circuit of the invention is fabricated and the relationship of input and output pads on the chip, relative thereto.

FIG. 1 is a schematic, simplified plan view of a chip 1 which may be employed as the lower chip of a chip on chip type IC package, and with which the circuit of the present invention may be employed. A plurality of bonding pads 2 and 2' are formed on the edges of the chip. Within the general area 3, there is fabricated the inner or main logic circuitry of the chip; the peripheral area 5 then is the area on which the checking circuit of the invention is fabricated. Typically, bonding pads such as 2 and 2' are formed on both the upper surface of the chip 1, as illustrated, and on the lower surface thereof (not shown), the latter being omitted from FIG. 1 for the sake of simplicity. The bonding pads 2 and 2' are connected variously to the checking circuit in the peripheral area 5 and to the signal terminals of the inner logic circuit in the area 3, in a manner to be described; the connections are not shown in FIG. 1, however, for the sake of simplicity and ease of illustration.

Figure 2:
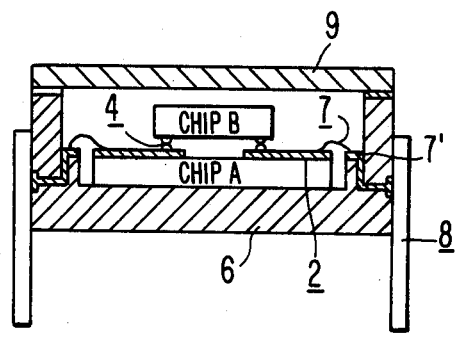
FIG. 2 is a schematic, simplified elevational view, partially in cross-section, of a chip on chip type IC package, illustrating the interconnection of the chips and related wiring thereof within the package.

As seen in FIG. 1, there may be two types of bonding pads, namely the longer pads 2 and the shorter or conventional pads 2', the latter typically being bonded directly to an output pin of the package 6. The longer pads 2 include, on their inner ends, corresponding protrusions 4 which are disposed so as to be in alignment with corresponding protrusions 4 on an upper chip, as illustrated in FIG. 2 and discussed hereinafter, so as to be bonded together and form an interconnection between the corresponding bonding pads of the upper and lower chip thereby to form a signal path interconnection therebetween. Independent protrusions 4' located directly on the substrate and not on the surface of a bonding pad 2, are provided in conventional fashion and may be connected to terminals of the inner logic circuit 3 of the chip 1 or connected to the ordinary bonding pads 2', depending on the circuit design of the upper and lower chips for a given device.

Area 5 of the chip 1, extending about the periphery of the main logic circuit area 3 and thus intermediate the logic circuit 3 and the bonding pads 2 and 2', also may have various input/output (I/O) circuits fabricated thereon, in addition to the checking circuit of the present invention. Since I/O circuits usually include large transistors, it is conventional to locate those circuits in the peripheral area 5 of the chip, to avoid interaction with the inner logic circuit in the area 3.

FIG. 2 is a schematic, simplified elevational view of a chip on chip type IC package employing a lower chip A, which may correspond to chip 1 of FIG. 1, and an upper chip B. Chip B may have a similar form and configuration as chip A, as illustrated by chip 1 in FIG. 1, but is dimensionally smaller so that the bonding pads 2 and 2' of the lower chip A are exposed when the upper chip B is positioned in facing relationship above the lower chip A. The protrusions 4 of the respective chips A and B, as before noted, are disposed so as to be in alignment when the lower and upper chips A and B are assembled in facing relationship, as seen in FIG. 2; the corresponding protrusions 4 of chips A and B then are integrally joined by thermal-compression bonding, for example, to complete the plurality of interconnections between the upper and lower chips A and B. The protrusions 4 are shown on a greatly enlarged scale, relative to other elements in the illustration of FIG. 2, to clarify the structure of the component elements of a typical chip on chip type IC package. The bonding pads 2 further are connected by corresponding wires 7 to respectively corresponding pads 7' on the package 6, typically by bonding, the pads 7' further being electrically connected to respectively corresponding external connection pins 8. The package 6 typically is covered and sealed by a lid 9.

Figure 3:
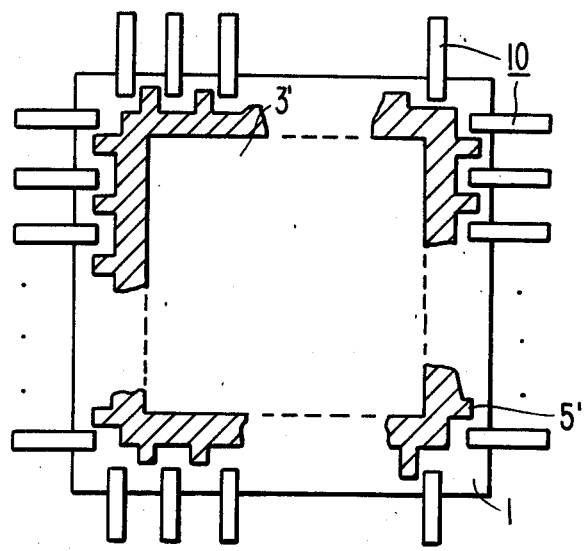
FIG. 3 is a simplified schematic plan view, similar to that of FIG. 1, illustrating an upper chip having an alternative beam lead structure providing for interconnections with the lower chip, for use in a chip on chip type IC package.
Figure 4:
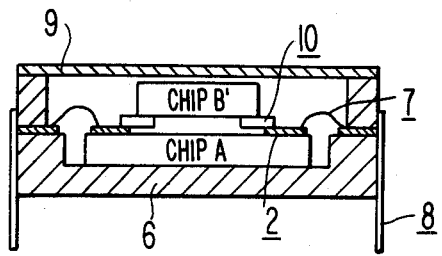
FIG. 4 is a simplified schematic, elevational view, partially in cross-section, of a chip on chip type IC package, illustrating the interconnections between chips employing a beam lead type upper chip, as in FIG. 3.

FIGS. 3 and 4 comprise related, schematic and simplified plan and elevational views, the latter partially in cross-section, of a chip on chip type IC having a beam lead structure. Particularly, beam leads 10 are formed on the upper chip B, which is shown in the simplified schematic plan view of FIG. 3, so as to extend laterally beyond the periphery of the upper chip B; moreover, the beam leads 10 are positioned so as to be aligned with corresponding bonding pads 2 of the lower chip A when the chips A and B are assembled in facing relationship as seen in FIG. 4, thereby to be bonded together and complete interconnections between chips A and B. The area 5' of the upper chip B, as seen in FIG. 3, again is disposed between a central area 3' on which the inner or main logic of the chip B is formed and thus to extend between the area 3' and the beam leads 10 the latter extending beyond the periphery of the chip B along all four edges. Area 5' of chip B again serves as the location for fabrication of I/O circuits and a portion of the circuit of the invention.

Both the protrusions 4 and 4' of FIG. 1 and the beam leads 10 of FIG. 3 may be fabricated by conventional photolithographic masking and electrical plating techniques, for example. The corresponding structures are well known in the art and thus further explanation is not deemed necessary. Likewise, as before noted, there are many other structures and techniques for forming interconnections between upper and lower chips of chip on chip type IC's, for the common purpose of providing interconnections therebetween. The present invention is directed to a means for checking the integrity of the interconnections between the chips and thus not with the particular structure or technique by which the interconnections are formed. Accordingly, it is to be understood that the terms, interconnections, bonding pads, and the like, as employed throughout this specification are intended to be generic to any such structure or fabrication technique which affords signal paths extending between the signal terminals of individual, stacked chips of a chip on chip type IC structure.

It further is to be understood that pursuant to conventional procedures, the individual chips which are employed as upper and lower chips in a chip on chip type IC device are tested before being assembled and bonded together in a chip on chip type IC package and, moreover, that the IC package thus formed as well is tested as a finished product. Checking the integrity of the interconnections in accordance with the present invention is of great significance, even as to increasing the reliability and yield of such chip on chip type IC packages, because the integrity checking provides data which assists in analyzing defects in the assembled structure resulting in rejection of the completed devices, and thus affords a basis for improving the production processes including especially bonding techniques, to avoid such defects as actually are encountered.

Figure 5:
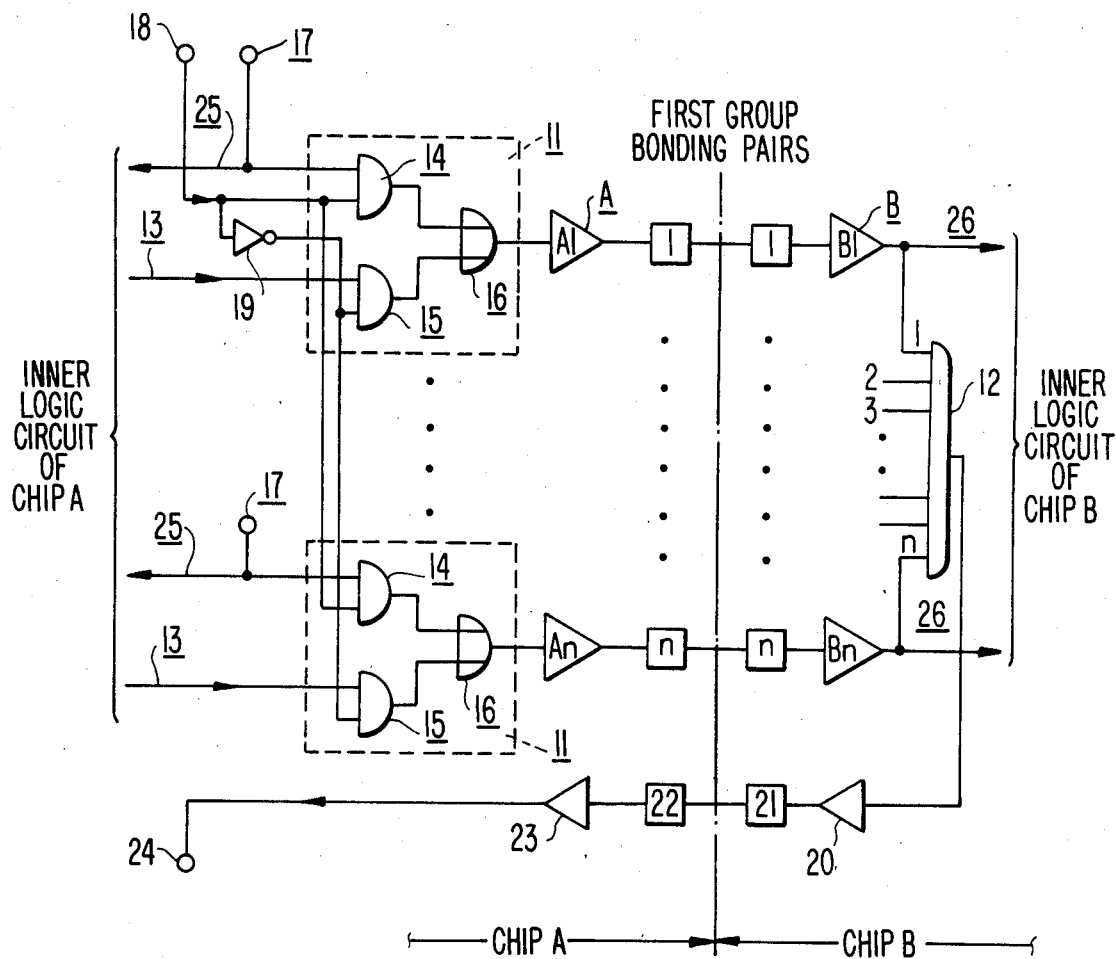
FIG. 5 is a circuit schematic of a checking circuit of a first type, in accordance with a first embodiment of the present invention, for checking interconnections defining signal paths from a lower chip to an upper chip.
Figure 6:
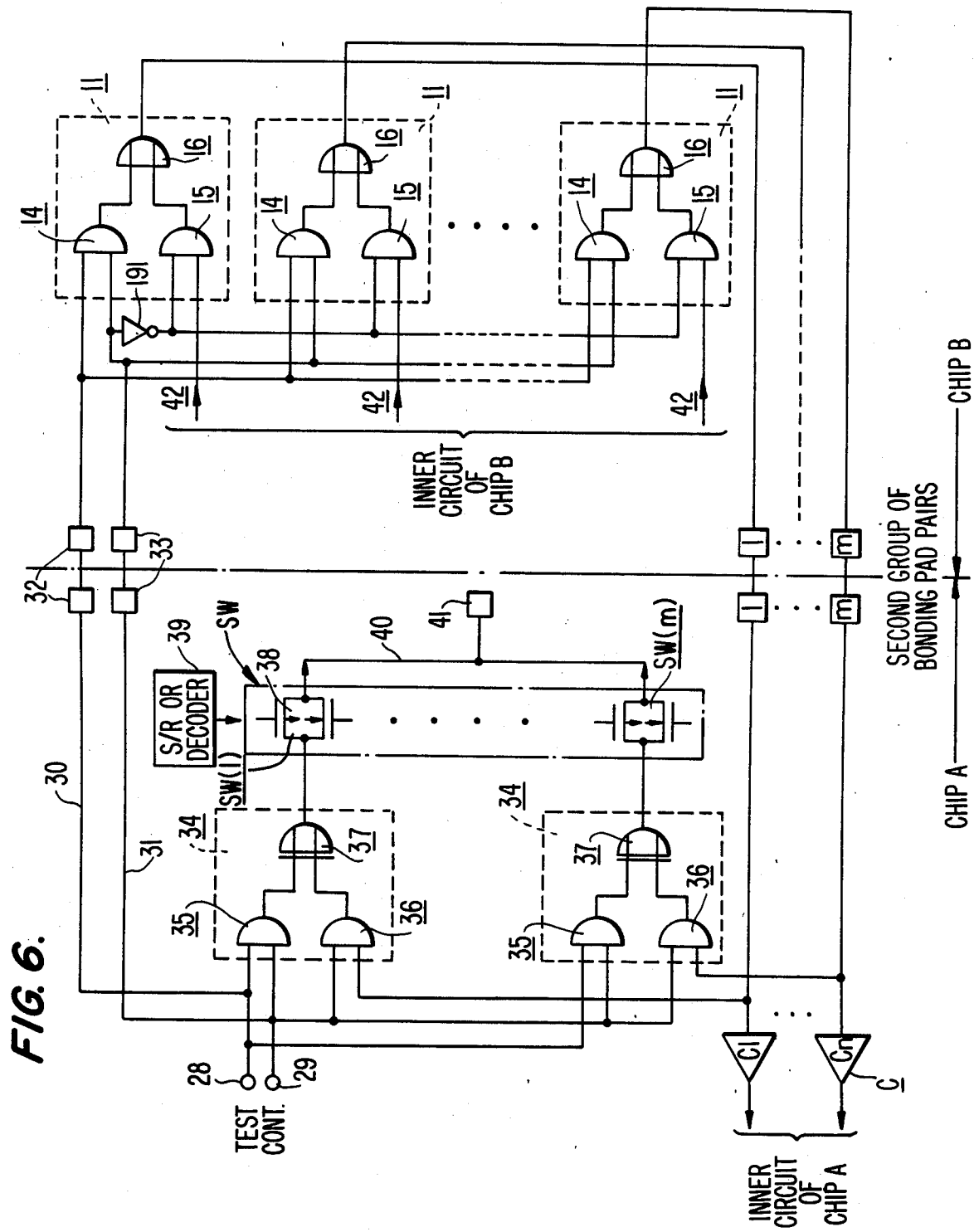
FIG. 6 a circuit schematic, partially in block diagram form, of a checking circuit of a second type in accordance with the first embodiment of the present invention, for checking interconnections defining signal paths from an upper chip to a lower chip.

FIGS. 5 and 6 comprise circuit diagrams of an integrity checking circuit in accordance with a first embodiment of the present invention; more specifically, FIGS. 5 and 6 respectively correspond to a first circuit for checking the integrity of interconnections defining the first type or direction of signal paths, i.e., from the lower chip to the upper chip, and a second circuit for checking the integrity of interconnections defining the second type or direction of signal paths, i.e., from the upper chip to the lower chip, of a chip on chip type IC package such as those illustrated variously in FIGS. 2 and 4. The circuits of FIGS. 5 and 6 accordingly are provided in the peripheral areas of the respective chips, for example, the chip area 5 in FIG. 1 or area 5' in FIG. 3, together with the I/O circuits of the respective chips. Moreover, the circuits of each of FIGS. 5 and 6 include respective portions on each of the chips A and B. As before noted, and as will be described more specifically with reference to FIGS. 5 and 6, the checking circuit in each instance is connected between the input pads and the output pads of its associated chip and is switched selectively to an operating mode in which it is isolated from the inner or main logic circuit, permitting the latter to perform in its normal and intended mode, or is switched to a checking circuit mode in which it bypasses the main or inner logic circuit, directly interconnecting the input bonding pads and the output bonding pads of its associated chip so as to transfer test signals directly through the interconnections to the other chip, individually and in succession, such that the presence of a test signal through the return signal path, before described, confirms the integrity of the individual interconnections.

In each of FIGS. 5 and 6, a dot-dash line represents the boundry between a lower chip A and an upper chip B of a given chip on chip type IC, FIG. 5 comprising the portion of the checking circuit associated with chip A for testing the integrity of interconnections defining signal paths for signals passing in the direction from chip A to chip B, and FIG. 6 comprising the checking circuit for checking the integrity of interconnections defining signal paths for signals travelling the direction of from chip B to chip A. Consistent with this delineation, there are schematically illustrated in FIG. 5 a first group of bonding pad pairs 1, 1 . . . n, n . . . representing "n" aligned and interconnected bonding pads of chip A and chip B which are interconnected for defining signal paths of the first direction. Likewise, in FIG. 6 there are designated a second group of bonding pad pairs 1, 1 . . . m, m representing "m" bonding pads on each of chip A and chip B which are aligned and interconnected to define corresponding signal paths in the direction from chip B to chip A. As will be understood, the numbers "n" and "m" of bonding pairs are not necessarily equal, and typically are not equal. Moreover, in each of FIGS. 5 and 6, the portions of the circuits delineated by the dot-dash line in each instance are formed on the corresponding chip A or chip B as there designated. Further, the checking circuits are formed on the associated chips by conventional processes at the same time as the inner logic and other circuits are fabricated on the individual chips.

With specific reference to FIG. 5, the checking circuit formed on chip A comprises a plurality of selection circuits 11, each of identical internal configuration, connected through respectively corresponding output buffer circuits A, individually designated A1 through An, to respectively corresponding output bonding pads 1 through n of the first group of bonding pad pairs. The output bonding pads 1 through n of chip A furthermore are connected through the respectively corresponding selection circuits 11 and lines 13 to the output terminals of the inner logic circuit of chip A. In the normal operating mode, the selection circuits 11 thus serve to selectively connect corresponding outputs of the inner logic circuit of chip A to the output bonding pads 1 through n, as hereinbefore described. Additionally, the test terminals 17 respectively associated with the selection circuits 11 serve a dual role, comprising both input terminals for test signals during integrity checking of the interconnections and normal signal input terminals, as connected through respective lines 25 to the inner logic circuit of chip A. Thus, the test terminals 17 may be fabricated commonly as, and comprise, input bonding pads on the chip A to which normal input signals are applied, as well as input terminals for test signals.

With respect to the upper chip B, the associated input bonding pads 1 through n of the first group of bonding pad pairs are connected through respectively corresponding input buffer circuits B, specifically designated B1 through Bn, and through respectively corresponding lines 26 to respective input terminals of the inner logic circuit of the chip B (not shown). Additionally, the output terminals of the input buffer circuits B1 through Bn are connected as the inputs 1 through n, respectively, to an n-input AND gate 12. The output f AND gate 12 is connected through an output buffer circuit 20 to an output bonding pad 21, or corresponding protrusion, on chip B. A corresponding bonding pad 22, or protrusion, is provided on chip A which is interconnected with the pad 21 on chip B for defining a return signal path from AND gate 12 on chip B to chip A, the pad 22 further being connected through an input buffer circuit 23 to a detection terminal 24 on chip A. The terminal 24 typically would be fabricated as an output bonding pad.

Each of the selection circuits 11 comprises two AND gates 14 and 15 and an OR gate 16. Each associated input pad/test terminal 17 is connected to a first input of AND gate 14. A control terminal 18, fabricated as a further bonding pad 2 as seen in FIG. 1, is connected to the second input terminal of AND gate 14. A bonding pad 2 serving as the control terminal 18 thus is provided in addition to the bonding pads necessary for the normal signal processing of the chip on chip IC device. Each output line 13 from the inner logic circuit of chip A is connected to a first input of AND gate 15 of its associated selection circuit 11. Finally, the control terminal 18 is connected through an inverter 19 in common to a second input terminal of each AND gate 15, for all of the AND gates 15 of the selection circuits 11. The outputs of the OR gates 16 comprising the outputs of the respective selection circuits 11, as before noted, are connected to the respective output buffer circuits A. Thus, each of the selection circuits 11 has associated respectively therewith a corresponding test terminal 17 and lines 13 and 25, whereas the control terminal 18 and inverter 19 are connected in common to all of the selection circuits 11.

To permit normal operation of the inner logic circuit of chip A, a "0" logic level signal is applied to control terminal 18, thereby disabling the first AND gate 14 and operating through inverter 19 to supply an enabling "1" logic level input to the second input terminal of each of the second AND gates 15 of the selection circuits 11. As will be recalled, the test terminals 17 may be fabricated as input pads serving identically as signal input terminals of the chip A. Accordingly, input signals to chip A are transmitted through the lines 25 to the inner logic thereof, and correspondingly output signals from the inner logic circuit of chip A are supplied through associated lines 13 to the first input terminals of the second AND gates 15 of the respective selection circuits 11. The outputs of the AND gates 15 thus correspond to the signals from the inner logic circuit of chip A appearing on line 13 and produce corresponding "1" or "0" logic level signals as the outputs of the corresponding AND gates 15. Since the AND gates 14 are disabled and produce "0" logic level outputs, in turn applied to the respective OR gates 16, the outputs of the OR gates 16 and thus of the respective selection circuits 11 correspond identically to the logic signals on the respective lines 13 received from the inner logic circuit. In effect, the selection circuits 11 directly connect the associated output lines 13 of the inner logic circuit through the corresponding output buffer circuits A1 through An to the respective output bonding pads 1 through n. Assuming the interconnections between the first group of bonding pad pairs are fully functional, the signals thereafter are received by the corresponding bonding pads 1 through n of chip B and applied through the respective input buffer circuits B1 through Bn and associated lines 26 to the inner logic circuit of chip B, permitting the chip on chip type IC device to function in its normal manner.

In the checking or testing mode, a "1" logic level signal is applied to the control terminal 18 of chip A, as seen in FIG. 5, which functions directly as an enabling input to the second input terminal of the first AND gate 14 of each of the selection circuits 11 and is applied through inverter 19 as a disabling, "0" logic level signal to the second input terminal of the second AND gate 15 of each of the selection circuits 11. The disabling, "0" logic level inputs to the AND gates 15 thus isolate the inner logic circuit from the output terminals 1 through n of chip A.

The testing of the plurality of interconnections is performed in individual succession for the first group of bonding pad pairs 1, 1, . . . n, n. The test in each instance is identically performed. Considering, for example, the uppermost selection circuit 11 in FIG. 5, the application of logic "0" or "1" test signals to test terminal 17 will produce corresponding logic "0" or "1" signals at the output of AND gate 14; since AND gate 15 is disabled and produces a constant "0" logic level output, the output of OR gate 16 will correspond identically to the output of AND gate 14 and thus to the test signal sequence applied to the test terminal 17. All remaining test terminals are maintained at a logic "1" level. Accordingly, assuming that the interconnection between the first pair 1, 1 of bonding pads is proper, the same sequence of "0" or "1" logic level signals as was applied to the first test terminal 17 of chip A is received by the corresponding input pad 1 on chip B and applied through input buffer B1 to the topmost input (1) of AND gate 12. Since all remaining test terminals 17 of chip A are maintained at a "1" logic level, a "1" level is supplied through the corresponding selection circuits 11 to bonding pad pairs 2, 2, through n, n, and thus "1" logic level signals are applied to the remaining inputs (2) through (n) of the AND gate 12. As a result, the output signal from AND gate 12, assuming the interconnection between the bonding pad pair 1, 1 is proper, will match the sequence of "0" and "1" logic level signals applied to test terminal 17. The output signal from AND 12 then is supplied through the return signal path comprising output buffer circuit 20, the interconnected pads 21, 22, and the input buffer circuit 23 to the detection terminal 24. Thus, by comparing the return test signal appearing at the detection terminal 24 with the test signal applied to test terminal 17, the integrity of the interconnection corresponding to each such test terminal 17 may be determined readily and in individual succession.

The actual testing function may be performed easily by a wafer probe tester, for example, or other test equipment well known to those of skill in the art. It is significant to note that only two additional bonding or input/output pads are required for the checking circuit of FIG. 5, namely that for control terminal 18 and that for detection terminal 24; as noted, the pads 21 and 22 may be simple protrusions, sufficient to provide the required interconnection to complete the return signal path from chip B to chip A.

The circuit of FIG. 6, as before noted, checks the integrity of the interconnections defining the second type or direction of signal paths, i.e., from chip B to chip A. As before, the portions of the circuit of FIG. 6 which are formed on chip A versus those portions formed on chip B are delineated by the dot-dash line. Thus, with reference to the portion of the circuit on chip A, there is provided a second test terminal 28 and a second control terminal 29; in fact, the second control terminal 29 may be identical to the control terminal 18 and thus be implemented by an identical bonding pad. The external terminals 28 and 29 are connected to chip B through wiring lines 30 and 31, and bonding pad pairs 32, 32 and 33, 33, respectively; thus, while implemented as external pads on chip A, the terminals 28 and 29 (18) are accessible to external test equipment for operating the portions of the checking circuit fabricated on chip B. Particularly, chip B includes a plurality (m) of selection circuits 11, each of which is identical to the selection circuits 11 of FIG. 5, and which respectively correspond to the bonding pad pairs 1 through m of the second group. The selection circuits 11 of chip B are connected in common to the test terminal 28, at the first input of the first AND gate 14 in each instance, unlike those of FIG. 5; similarly to FIG. 5, however, the control terminal 29 (18) is connected directly and in common to the second input of the first AND gate 14 of all selection circuits 11 and through an inverter 19' to the first input of the second AND gate 15 of all selection circuits 11. In similar fashion to the circuit of FIG. 5, the second input terminal of the second AND gate 15 of each of the selection circuits 11 in FIG. 6 is connected through a respectively associated line 42 to a corresponding output terminal of the inner, or main, logic circuit of chip B.

The portion of the checking circuit of FIG. 6 fabricated on chip A comprises a plurality of comparing circuits 34 equal in number (m) to the number (m) of bonding pad pairs 1, 1 through m, m. Each comparing circuit 34 comprises a third AND gate 35, a fourth AND gate 36 and an EXCLUSIVE OR gate 37. The second test terminal 28 is connected in common to the first input of each of the third AND gates 35. The control terminal 29, moreover, is connected in common to the second input of the third AND gate 35 and to the first input of the fourth AND gate 36 for each of the comparing circuits 34. The second input terminal of the fourth AND gate 36 of each of the comparing circuits 34 is connected to the respective one of the bonding pads 1 through m of chip A through corresponding wiring lines; it further is connected through respectively associated input buffer circuits C, specifically designated C1 through Cm, to corresponding input terminals of the inner or main logic circuit of chip A.

In each of the comparing circuits 34, the outputs of the associated AND gates 35 and 36 are applied as inputs to an EXCLUSIVE OR gate 37, the output of which comprises the output of the corresponding comparing circuit 34; these outputs then are supplied to respective switches SW(1) through SW(m) of a switch array 38. The switches SW(1) through SW(m) may be of any suitable type, illustratively being shown in each instance as implemented by a pair of p-channel and n-channel FET's. The switches are controlled by a shift register (S/R) or decoder 39, which functions to select the switches in individual succession so as to pass the input signal received thereby from the corresponding comparing circuit 34 to a second determination terminal 41 over a common connecting line 40. The configuration of the switch array 38 and the associated controller 39, be it a shift register, decoder or other mechanism, may be of any conventional type, the function being to connect, selectively and in succession, the outputs of the individual comparing circuits 34 to the terminal 41.

In the normal operating mode of the checking circuit of FIG. 6, a "0" logic level signal is applied to the control terminal 29, and transmitted through connecting line 31 and bonding pad pair 33, 33 to the AND gates 14 of all selection circuits 11, disabling same; that same signal is applied through inverter 191 in common to the AND gates 15, providing a first enabling signal to the latter. As in FIG. 5, disabling of AND gates 14 isolates the selection circuits 11 from the test terminal 28 while enabling of AND gates 15 permits the output signals from the inner logic circuit of chip B, present on lines 42, to pass therethrough and through the respectively associated OR gates 16 to produce corresponding output signals from the selection circuits 11. The output signals from selection circuits 11 of chip B are communicated through the respective lines and bonding pad pairs 1, 1 through m, m of the second group and the associated buffer circuits C1 through Cm to the corresponding input terminals of the inner logic circuit of chip A. In this manner, chip B functions in conjunction with chip A with respect to the second direction of signal paths, in the normal and intended mode of operation of the chip on chip IC device. It will be recognized in this regard that the input signals to chip B from chip A are transmitted in accordance with the normal operating mode of the circuit of FIG. 5, previously discussed. Likewise, in the normal operating mode, the comparing circuits 34 are disabled by the "0" level signal on control terminal 29 which is applied in common to an input of each of the AND gates 35 and 36 of each of the comparing circuits 34.

In the integrity checking mode, a "1" logic level signal is applied to control terminal 29 which thus supplies a first enabling input to the AND gates 14 of each of the selection circuits 11 of chip B, through the connecting line 31 and the bonding pad pair 33, 33; the "1" logic level signal also functions through inverter 19' to produce a "0" logic level signal which disables the second AND gates 15 of each of the selection circuits 11, thus isolating the inner logic circuit of chip B and preventing the output signals from the inner logic circuit of chip B from being transferred to chip A. The sequence of logic "0" and "1" signals applied to the test terminal 28 is transmitted through line 30 and bonding pad pair 32, 32 and applied in parallel to the selection circuits 11 of chip B which function, through the enabled AND gates 14 and OR gates 11, to reproduce the same sequence on the output lines thereof which thus are transmitted to the bonding pads 1 to m of chip B. Assuming the interconnections are functional, the test signal sequence is transmitted in parallel through the second group of bonding pad pairs 1, 1 through m, m, and the corresponding lines of chip A to the respectively corresponding comparing circuits 34 on chip A. Particularly, the test signals are applied to the second intput terminals of the AND gates 36 of the respectively corresponding comparing circuits 34.

Each of the comparing circuits 34 thus receives the sequence of test signals supplied to test terminal 28 through two parallel paths. The first path comprises a direct connection from the test terminal 28 to the first input of AND gate 35, in each comparing circuit 34; since each AND gate 35 is enabled by the "1" logic level control signal applied to control terminal 29 (18), the original test sequence is produced at the output of AND gate 35 and applied to the first input of an EXCLUSIVE OR gate 37. The second, parallel path for the test signal sequence extends from the test terminal 28, the line 30 and the specially provided bonding pad pair 32, 32, through the corresponding selection circuit 11 and then through the respectively associated one of the second group of bonding pad pairs 1, 1 through m, m and the respective interconnections therebetween, to the second input of the associated AND gate 36. Similarly to AND gates 35, the AND gates 36 are simultaneously enabled by the "1" logic level control signal applied to control terminal 29. Thus, assuming that all of the interconnections are proper, the AND gate 36 of each comparing circuit 34 as well will produce at its output, and apply to the second input of each EXCLUSIVE OR gate 37, the identical sequence of test signals as was supplied initially to the test terminal 28. As will be understood, the EXCLUSIVE OR gate 37 of each comparing circuit 34, assuming all interconnections are proper, correspondingly will produce a continuing "0" logic level output regardless of the particular "1" and "0" logic levels of the test signal sequence. For example, if the test signal sequence applied to terminal 28 varies from "1" to "0" (10), the output of each of the third AND gates 35 correspondingly is the matching sequence (10). If all of the interconnections are complete (and assuming all remaining wiring as well is complete), the outputs of the fourth AND gates 36 likewise will be this same sequence (10). As a result, the outputs of the EXCLUSIVE OR gates 37 will be a continuing "0" logic level sequence (00). Conversely, if any interconnection is imperfect, the return test signal sequence will differ from the original; assuming the original to be (10), the return sequence may be of any of (00, 11, or 01). As a result, for each such imperfect interconnection, the AND gate 36 of the corresponding comparing circuit 34 will produce this same, differing logic level sequence output, i.e., (00), (11), or (01). As a result, the output of the EXCLUSIVE OR gate 37 of each comparing circuit 34 receiving such a differing return signal sequence correspondingly will differ from the expected sequence (00)—for the examples given, producing the respective outputs (10), (01), or (11). Thus, if all interconnections are fully operable, the output signals from the comparing circuits 34 will all be "0"; conversely, for any interconnection which is imperfect, the output signal from the corresponding comparing circuit 34 will include a logic "1" signal in the sequence.

The output signals from the comparing circuits 34 then are sampled, or commutated, by the switch array 38 so as to be supplied in sequence to the second detection terminal 41. By knowing the switching time sequence of the array 38, the occurrence of a logic "1" output at the second detection terminal 41 can be correlated with the corresponding interconnection, for identifying same as defective.

The fabrication of the circuit of FIG. 6, much like that of FIG. 5, requires only minimal additional elements beyond those routinely required for the normal operation of the inner logic circuit of chip B. Particularly, the only additional bonding pads are those required to form the bonding pad pairs 32, 32 and 33, 33, the second detection terminal 41, and the second test terminal 28. Although the control terminal 29 may be fabricated as an additional bonding pad, as before noted, it may be identical to that employed for the control terminal 18 in the circuit of FIG. 5. As one of skill in the art will appreciate, the actual testing function employing the checking circuit of the invention may be performed by a conventional probe checker, for example.

The circuits of FIGS. 5 and 6 assume that the first group of bonding pad pairs 1, 1, through n, n, are used exclusively for the first signal path direction from the lower to the upper chip and that the second group of bonding pad pairs 1, 1, through m, m, are used exclusively for the second signal path direction from the upper chip to the lower chip. Thus, two separate, single direction checking circuits, namely those of FIGS. 5 and 6, respectively, are provided.

Figure 7:
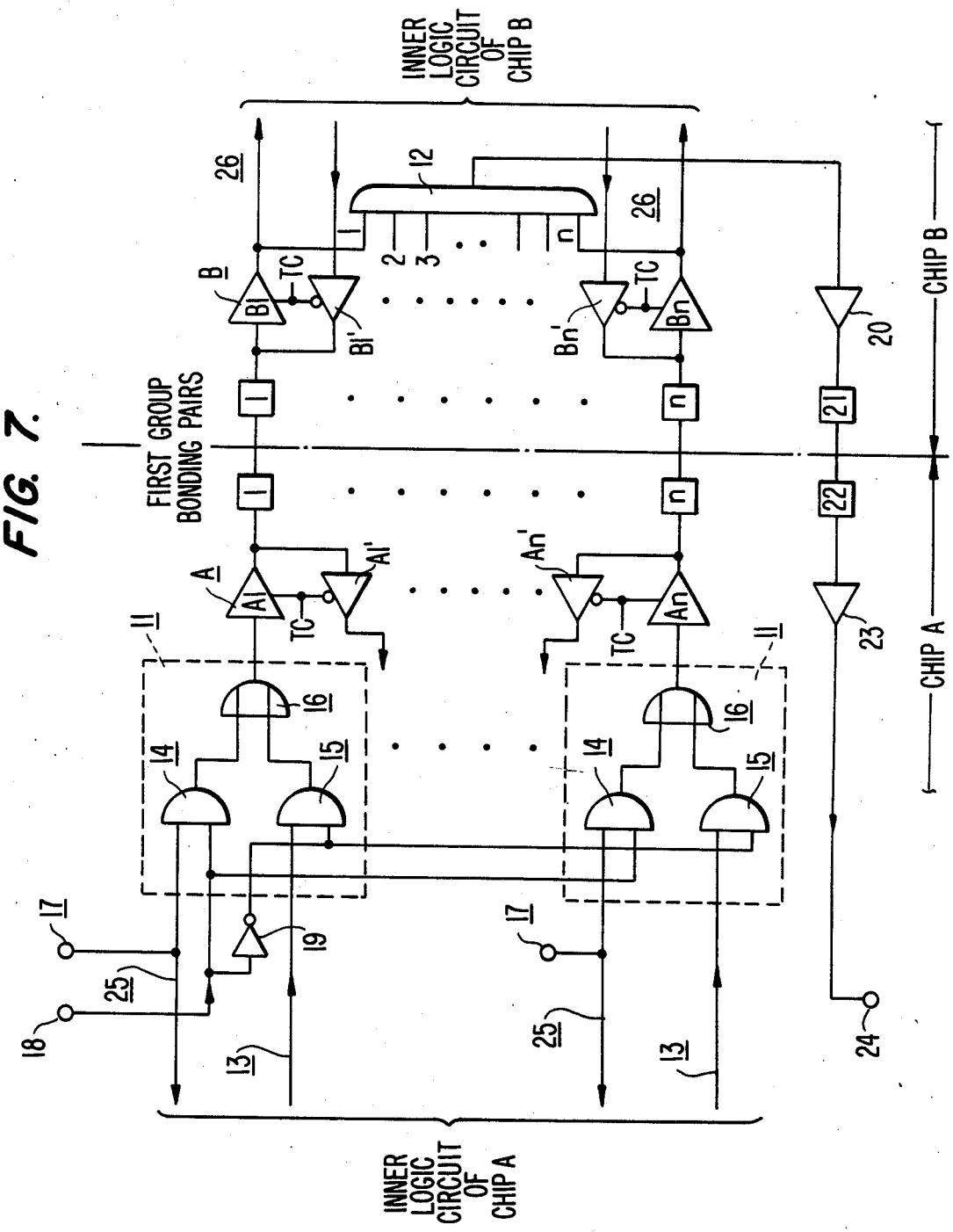
FIG. 7 is a circuit schematic of a checking circuit in accordance with a second embodiment of the present invention, comprising a modification of the circuit of FIG. 5, for checking the integrity of interconnections which define selectively bidirectional signal paths.

However, where the bonding pad pairs and associated interconnections are commonly used for input and output signals for each of the chips A and B and thus define bidirectional signal paths, a single checking circuit based on a modification of the circuit of FIG. 5, but employing tri-state buffer circuits, may be used, in accordance with a second embodiment of the invention, shown in FIG. 7. FIG. 7 retains the delineation by a dash-dot line of the circuit elements respectively fabricated on chip A and chip B; however, since the circuit of FIG. 7 is designed for bidirectional signal paths through the interconnections between chip A and chip B, there is designated only a single group of bonding pad pairs. Further differences from FIG. 5 are as follows. Chip A is provided with input buffer circuits A1'-An', and chip B is provided with output buffer circuits B1' through Bn'; further, all of the buffer circuits A1 through An, A1' through An', B1 through Bn, and B1' through Bn', comprise tri-state buffer circuits. In the schematic, the letters TC designate a tri-state control signal. When the TC signal is a "1" logic level, the buffer circuits A1-An and B1-Bn are enabled and the buffer circuits A1'-An' and B1'-Bn' are disabled. Conversely, when the TC signal is a "0" logic level, the buffer circuits A1-An and B1-Bn are disabled and the buffer circuits A1'-An' and B1'-Bn' are enabled. In both instances, the output impedance of the buffer circuits in the disabled state is very high. The outputs of the buffer circuits A1'-An' are supplied to the inner logic circuit A, and the inputs of the buffer circuits B1'-Bn' are supplied with the output signals of the inner logic circuit B.

When the checking mode of operation is produced by application of a logic "1" level signal to control terminal 18, the tristate signal TC is maintained in a logic "1" level. As a result, the buffer circuits A1'-An' and B1'-Bn' are disabled and thus effectively bypass the corresponding inner logic circuits of the associated chips. Thus, the integrity of all the signal path interconnections may be tested by the circuit of FIG. 7 in the manner as described with respect to FIG. 5.

The integrity checking circuit of the present invention thus permits checking the integrity of the interconnections formed in chip on chip type IC devices, for determining the acceptability of a given such IC and thereby contributing toward increased reliability of such IC's. It is clear that the checking circuit of the invention is not dependent upon the particular type of interconnection but rather is of general applicability for checking such interconnections in any chip on chip type IC device. Further, numerous modifications and adaptations of the present invention will be apparent to those of skill in the art. For example, logic level signals as hereinabove described may be inverted with slight modification of the circuit, and other such changes in specific circuit elements may readily be made. Accordingly, it is intended by the appended claims to cover all such modifications and adaptations of the present invention which fall within the true spirit and scope of the appended claims.

What is claimed is:

1. A chip on chip type integrated circuit device which includes a circuit for checking the integrity of each of a plurality of electrical interconnections formed between upper and lower chips of said chip on chip type integrated circuit device, each said chip comprising a logic circuit having plurality signal terminals and plural bonding pads respectively corresponding to said plural signal terminals, each said interconnection being formed between a respectively corresponding pair of associated bonding pads of said upper and lower chips for completing a signal path therebetween, said device comprising:
   said lower chip comprising:
   plural selection means for respectively connecting said plural signal terminals and said respectively coresonding, plurality bonding pads of said upper chip to said respectively corresponding bonding pads thereof, and a checking mode for isolating said respective signal terminals from said respectively corresponding bonding pads thereof;
   means for applying a control signal to said selection means for switching said selection means selectively to one of said normal operating mode and said checking mode thereof;
   means for applying test signals to said selection means, each said selection means, in said checking mode thereof, transmitting test signals applied thereto to said bonding pad respectively corresponding thereto;
   said upper chip comprising:
   a terminal connected to said bonding pads thereon, of said pairs of associated bonding pads, receiving test signals transmitted by said selection means associated with said lower chip and conducted through said signal paths completed by said electrical interconnections formed between said pairs of associated bonding pads and producing outputs corresponding to the test signals, as received through said completed signal paths; and
   means responsive to the outputs produced by said receiving terminal, and including a detection terminal formed on said lower chip and a return signal path extending from said signal receiving means of said upper chip to said detection terminal on said lower chip for determining the integrity of the respectively corresponding interconnections and providing an output indicating the results of the integrity determination for each such interconnection at said detection terminal.

2. A circuit as recited in claim 1, wherein said return signal path includes a first return signal path portion on said upper chip, an associated pair of return signal bonding pads on said upper and lower chips, an interconnection between said associated pair of return signal bonding pads, and a second return signal path portion on said lower chip connecting said return signal bonding pad of said lower chip to said detection terminal.

3. A circuit as recited in claim 1, wherein:
   said plurality of electrical interconnections comprises a first group thereof completing signal paths of a first direction from said lower chip to said upper chip and a second group thereof completing signal paths of a second, opposite direction from said upper chip to said lower chip;
   said pairs of associated bonding pads of said upper and lower chips comprise first and second groups thereof respectively corresponding to said first and second groups of electrical interconnections;
   said plurality of selection means comprises a first group of plural selection means disposed on said lower chip and a second group of plural selection means disposed on said upper chip, each of said first and second groups of plural selection means respectively connecting said signal terminals of said logic circuit of the respective said chip to the respectively corresponding bonding pads of the corresponding said chip;
   said means for applying a control signal to said selection means comprises first and second control signal applying means disposed respectively on said lower and upper chips, respectively associated with said first and second groups of selection means of the respective said lower and upper chips;
   said test signal applying means comprises first test signal applying means for applying test signals to said first group of selection means of said lower chip and second test signal applying means for applying test signals to said second group of selection means of said upper chip;

said means for receiving test signals comprises first means disposed on said upper chip for receiving test signals transmitted through said first group of interconnections and second means disposed on said lower chip for receiving test signals transmitted through said second group of interconnections; and said responsive means comprises first means, disposed in part on said lower chip, responsive to outputs of said first receiving means disposed on said lower chip and second means, disposed on said lower chip, responsive to outputs of said second receiving means.

4. A circuit as recited in claim 3, wherein said first receiving means disposed on said upper chip comprises an OR gate having a plurality of inputs corresponding to said interconnections of said first group and means individually connecting each of said bonding pads of said associated pairs of bonding pads of said first group to corresponding inputs of said OR gate.

5. A circuit as recited in claim 4, wherein said individual connecting means comprise respective input buffers connected between said bonding pads and said corresponding OR gate inputs.

6. A circuit as recited in claim 3, wherein said return signal path comprises a return signal path bonding pad on each of said lower and upper chips associated as a pair, an output buffer circuit on said upper chip connecting the output of said first receiving means to said return signal bonding pad of said upper chip, and an input buffer circuit on said lower chip connecting said return signal bonding pad of said lower chip to said detection terminal.

7. A circuit as recited in claim 6, wherein said first test signal applying means comprises:
a plurality of first test signal terminals corresponding to said first group of plural selection circuits of said lower chip; and
means individually connecting the respective said first test signal terminals to the corresponding said first group of plural selection circuits of said lower chip, said first test signals being applied to said plurality of test signal terminals in individual succession; and
said first group of selection circuits, in said checking mode, correspondingly transmitting said test signals through said interconnections of said first group, in individual succession.

8. A circuit as recited in claim 7, wherein said plurality of first test signal terminals comprise bonding pads mounted on said lower chip.

9. A circuit as recited in claim 8, wherein said bonding pads providing said first test terminals additionally are connected to said input signal terminals of said inner logic circuit of said lower chip, for supplying input signals thereto.

10. A circuit as recited in claim 3, wherein:
said second receiving means comprises a plurality of comparing circuits disposed on said lower chip, respectively corresponding to said second group of plural interconnections, for receiving test signals received therethrough; and
said second responsive means comprises a second detection terminal disposed on said lower chip and commutating means disposed on said lower chip and connected to the outputs of said plurality of comparing circuits for sampling said outputs individually, in time sequence, and supplying said sampled time sequential outputs to said second determination terminal.

11. A circuit as recited in claim 10, wherein said second test signal applying means comprises:
a second test signal terminal provided on said lower chip; and
means connecting said second test signal terminal on said lower chip in common to said plurality of selection circuits of said upper chip.

12. A circuit as recited in claim 1, wherein:
said interconnections complete selective, bidirectional signal paths between said pairs of associated bonding pads of said upper and lower chips;
said means for receiving test signals is disposed on said upper chip; and
said means responsive to the outputs of said receiving means comprises a detection terminal mounted on said lower chip and means connecting the output of said receiving means of said upper chip to said detection terminal of said lower chip.

13. A circuit as recited in claim 12, wherein:
said logic circuit of each of said lower and upper chips comprises plural input and plural output signal terminals; and
said plurality of selection means are provided on said upper chip and are connected to the respectively corresponding signal output terminals of said logic circuit of said lower chip, and there are further provided:
a plurality of output tri-state buffer circuits disposed on said lower chip, corresponding to said plurality of selection means, connecting the outputs of the corresponding selection means to the respectively corresponding bonding pads of said lower chip, of said associated pairs of bonding pads;
a plurality of input tri-state buffer circuits disposed on said lower chip, connecting respective said bonding pads of said lower chip, of said associated pairs of bonding pads, to respectively corresponding input terminals of said inner logic circuit of said lower chip;
a plurality of input tri-state buffer circuits disposed on said upper chip connecting respective said bonding pads of said upper chip, of said associated pairs of bonding pads, to respectively corresponding said input signal terminals of said logic circuit of said upper chip;
a plurality of output buffer circuits, disposed on said upper chip, connecting respectively corresponding output signal terminals of said logic circuit of said upper chip to respectively associated bonding pads of said upper chip, of said associated pairs of bonding pads;
means for applying tri-state control signals to said tristate buffer circuits of said lower and upper chips in accordance with the signal path direction to be established through the respectively corresponding bidirectional signal path interconnections between said lower and upper chips;
an OR gate disposed on siad upper chip having plural inputs respectively corresponding to said plurality of interconnections, each said input being connected to the output of the input buffer circuit of said upper chip associated with the corresponding interconnection; and
means connecting the output of said OR gate to said detection terminal of said lower chip.

14. A circuit as recited in claim 12, wherein said output responsive means comprises a detection terminal mounted on said lower chip and a return signal path connecting the output of said OR gate to said detection terminal.

15. A circuit as recited in claim 14, wherein said return signal path comprises:
- a corresponding pair of associated return signal path bonding pads on said lower and upper chips, respectively, and an interconnection therebetween;
- an output buffer circuit connecting the output of said OR gate to said return signal path bonding pad of said upper chip; and
- an input buffer circuit connecting the return signal path bonding pad of said lower chip to said detection terminal.

16. A method for checking the integrity of each of a plurality of electrical interconnections formed between upper and lower chips of a chip on chip type integrated circuit device each said chip comprising a logic circuit having plural signal terminals and plural bonding pads respectively corresponding to said signal terminals, each said interconnection being formed between a respectively corresponding pair of associated bonding pads of said upper and lower chips for completing a signal path therebetween, said plurality of electrical interconnections comprising a first group thereof completing signal paths of a first direction from said lower chip to said upper chip and a second group thereof completing signal paths of a second, opposite direction from said upper chip to said lower chip, said second group of interconnections normally receiving outputs from said logic circuit of said upper chip for transmission through said second group of interconnections to signal input terminals of said logic circuit of said lower chip, said method comprising:
- selectively isolating the logic circuit of said lower chip from said bonding pads thereof, of said pairs of associated bonding pads of said lower and upper chips, to establish a checking mode for checking the integrity of said plurality of electrical interconnections;
- in said checking mode, applying test signals to said bonding pads of said lower chips, of said pairs of associated bonding pads;
- receiving test signals as transmitted through said interconnections between said pairs of associated bonding pads of said lower and upper chips at said upper chip and producing output signals corresponding to the test signals, as received through the bonding pads, of said associated pairs of bonding pads on said upper chip, independently of said logic circuit of said upper chip;
- transmitting the said output signals, corresponding to the test signals as received through said corresponding interconnections on said upper chip, from said upper chip to said lower chip;
- determining the integrity of said interconnections by monitoring the output signals transmitted from said upper chip to said lower chip, at a detection terminal on said lower chip;
- selectively isolating said logic circuit of said upper chip from said bonding pads of said upper chip, of said pairs of associated said bonding pads corresponding to said second group of interconnections;
- transmitting a test signal from said lower chip to said upper chip;
- receiving said test signal on said upper chip and transmitting same in bypass relationship to said isolated logic circuit thereof to said bonding pads of said upper chip corresponding to said second group of interconnections;
- receiving test signals transmitted through said interconnections of said second group at said corresponding bonding pads of said lower chip;
- comparing each said test signal as received through said interconnections of said second group with the corresponding test signal as transmitted from said lower chip to said upper chip; and
- producing an output, based on the results of comparison of said corresponding transmitted and received test signals, for each said interconnection of said second group, to indicate the integrity of the corresponding said interconnections of said second group.

17. A method as recited in claim 16, wherein said interconnections complete selective, bidirectional signal paths between said pairs of associated bonding pads of said upper and lower chips, further comprising:
- selectively enabling transmission through said interconnections between respectively corresponding pairs of associated bonding pads from said lower to said other chip; and
- transmitting said test signals through said interconnections in accordance with the said selectively enabled direction of transmission from said lower to the other of said chips.

* * * * *

UNITED STATES PATENT AND TRADEMARK OFFICE
CERTIFICATE OF CORRECTION

PATENT NO. : 4,703,483
DATED : October 27, 1987
INVENTOR(S) : Enomoto et al.

It is certified that error appears in the above-identified patent and that said Letters Patent is hereby corrected as shown below:

Col. 2, line 30, "a" (second occurrence) should be --an--;
line 52, "which" should be --with--.

Col. 3, line 7, "lowr" should be --lower--.

Col. 7, line 48, "f" should be --of--.

Col. 9, line 21, "AND 12" should be --AND gate 12--.

Col. 11, line 33, "intput' should be --input--.

Col. 12, line 66, "single" should be --first--.

Col. 13, line 62, "coresonding, plurality" should be --corresponding plural--.

Col. 16, line 56, "tristate" should be --tri-state--;
line 61, "siad" should be --said--.

Col. 17, line 12, "OR" should be --OR--.

Signed and Sealed this

Twenty-sixth Day of April, 1988

Attest:

DONALD J. QUIGG

*Attesting Officer*  *Commissioner of Patents and Trademarks*

UNITED STATES PATENT AND TRADEMARK OFFICE
CERTIFICATE OF CORRECTION

PATENT NO. : 4,703,483

DATED : October 27, 1987

INVENTOR(S) : Enomoto et al.

It is certified that error appears in the above-identified patent and that said Letters Patent is hereby corrected as shown below:

In Fig. 1, Box directly below each box labeled "2" should be labeled --2'--;

In Fig. 3, line extending from lower right corner of Figure should have --B-- inserted adjacent to the line;

In Fig. 4, change "CHIP B'" to --CHIP B--.

Signed and Sealed this

Twenty-first Day of June, 1988

Attest:

DONALD J. QUIGG

Attesting Officer

Commissioner of Patents and Trademarks